(12) United States Patent
Okigawa et al.

(10) Patent No.: US 12,159,940 B2
(45) Date of Patent: Dec. 3, 2024

(54) MULTILAYER STRUCTURE AND SEMICONDUCTOR DEVICE

(71) Applicant: FLOSFIA INC., Kyoto (JP)

(72) Inventors: Mitsuru Okigawa, Kyoto (JP); Yasushi Higuchi, Kyoto (JP); Yusuke Matsubara, Kyoto (JP); Osamu Imafuji, Kyoto (JP); Takashi Shinohe, Kyoto (JP)

(73) Assignee: FLOSFIA INC., Kyoto (JP)

( * ) Notice: Subject to any disclaimer, the term of this patent is extended or adjusted under 35 U.S.C. 154(b) by 433 days.

(21) Appl. No.: 17/575,838

(22) Filed: Jan. 14, 2022

(65) Prior Publication Data

US 2022/0140145 A1    May 5, 2022

Related U.S. Application Data

(63) Continuation-in-part of application No. PCT/JP2020/027576, filed on Jul. 15, 2020.

(30) Foreign Application Priority Data

Jul. 16, 2019   (JP) ................................ 2019-131461

(51) Int. Cl.
*H01L 29/872* (2006.01)
*H01L 21/02* (2006.01)
(Continued)

(52) U.S. Cl.
CPC .... *H01L 29/7869* (2013.01); *H01L 21/02414* (2013.01); *H01L 29/04* (2013.01);
(Continued)

(58) Field of Classification Search
CPC .......... H01L 29/7869; H01L 21/02414; H01L 29/04; H01L 29/24; H01L 29/47;
(Continued)

(56) References Cited

U.S. PATENT DOCUMENTS 9,379,190 B2 *   6/2016   Hitora ............... H01L 21/02433
2008/0142795 A1   6/2008   Ichinose et al.
(Continued)

FOREIGN PATENT DOCUMENTS

JP   2005-260101   9/2005
JP   2009-081468   4/2009
(Continued)

OTHER PUBLICATIONS

International Search Report issued Oct. 20, 2020 in International (PCT) Application No. PCT/JP2020/027576.
(Continued)

*Primary Examiner* — David Vu
(74) *Attorney, Agent, or Firm* — Wenderoth, Lind & Ponack, L.L.P.

(57) ABSTRACT

Provided are a multilayer structure in which crystal defects due to stress concentration in a semiconductor layer caused by an insulator film are prevented and a semiconductor device using the multilayer structure, the multilayer structure and the semiconductor device that are particularly useful for power devices. A multilayer structure in which an insulator film is arranged on a part of a semiconductor film, wherein the semiconductor film has a corundum structure and contains a crystalline oxide semiconductor containing one or two or more metals selected from groups 9 and 13 of the periodic table, and wherein the insulator film has a taper angle of 20° or less.

8 Claims, 10 Drawing Sheets

(51) Int. Cl.
  *H01L 29/04* (2006.01)
  *H01L 29/24* (2006.01)
  *H01L 29/47* (2006.01)
  *H01L 29/78* (2006.01)
  *H01L 29/786* (2006.01)

(52) U.S. Cl.
  CPC ............. *H01L 29/24* (2013.01); *H01L 29/47* (2013.01); *H01L 29/7842* (2013.01); *H01L 29/872* (2013.01)

(58) Field of Classification Search
  CPC ............. H01L 29/7842; H01L 29/872; H01L 21/0242; H01L 21/02433; H01L 21/02488; H01L 21/02494; H01L 21/02565; H01L 21/0262; H01L 21/02628; H01L 29/402; H01L 29/66969; H01L 29/0684
  See application file for complete search history.

(56) References Cited

U.S. PATENT DOCUMENTS

| | | | |
|---|---|---|---|
| 2011/0133210 A1* | 6/2011 | Horii | H01L 29/475 438/572 |
| 2015/0295096 A1* | 10/2015 | Oka | H01L 29/475 438/197 |
| 2017/0179249 A1 | 6/2017 | Oda et al. | |
| 2017/0221998 A1 | 8/2017 | Ebihara et al. | |
| 2017/0278706 A1 | 9/2017 | Oda et al. | |

FOREIGN PATENT DOCUMENTS

| | | |
|---|---|---|
| JP | 2013-012760 | 1/2013 |
| JP | 2013-258251 | 12/2013 |
| JP | WO2015/166608 | 11/2015 |
| JP | 2018-060992 | 4/2018 |
| JP | 2019-057569 | 4/2019 |

OTHER PUBLICATIONS

International Search Report issued Oct. 20, 2020 in International (PCT) Application No. PCT/JP2020/027577.

Jun Liang Zhao et. al., "UV and Visible Electroluminescence From a $Sn:Ga_2O_3/n^+$—Si Heterojunction by Metal-Organic Chemical Vapor Deposition", IEEE Transactions on Electron Devices, vol. 58, No. 5, pp. 1447-1451, May 2011.

Kohei Sasaki et. al., "Si-Ion Implantation Doping in $\beta$-$Ga_2O_3$ and Its Application to Fabrication of Low-Resistance Ohmic Contacts", Applied Physics Express 6, pp. 086502-1-086502-4, Jul. 2013.

Office Action issued Oct. 16, 2023 in corresponding Taiwanese Application No. 109123941, together with English translation thereof.

* cited by examiner (a)

(b)

(a)

(b)

MULTILAYER STRUCTURE AND SEMICONDUCTOR DEVICE

CROSS REFERENCE TO RELATED APPLICATION

This application is a continuation-in-part application of International Patent Application No. PCT/JP20201027576 (Filed on Jul. 15, 2020), which claims the benefit of priority from Japanese Patent Application No. 2019-131461 (filed on Jul. 16, 2019).

The entire contents of the above applications, which the present application is based on, are incorporated herein by reference.

1. FIELD OF THE INVENTION

The present disclosure relates to a multilayer structure and a semiconductor device using the multilayer structure, the multilayer structure and the semiconductor device that are useful for power devices and so forth.

2. DESCRIPTION OF THE RELATED ART

A conventional gallium oxide ($Ga_2O_3$) is a transparent semiconductor that has a wide band gap of 4.8 to 5.3 eV at room temperature and absorbs almost no visible light and ultraviolet light. For this reason, gallium oxide ($Ga_2O_3$) is a promising material to be used in photoelectric devices and transparent electronics that operate in a deep ultraviolet light range, in particular, and the development of photodetectors, light-emitting diodes (LEDs), and transistors based on gallium oxide ($Ga_2O_3$) has been conducted in recent years.

Moreover, a gallium oxide ($Ga_2O_3$) has five crystal structures: $\alpha$, $\beta$, $\gamma$, $\sigma$, and $\varepsilon$ and, in general, the most stable structure is $\beta$-$Ga_2O_3$. However, $\beta$-$Ga_2O_3$ is a $\beta$ gallia structure, which is different from a crystal system that is generally used in electronic materials and so forth; therefore, $\beta$-$Ga_2O_3$ is not always suitable for use in semiconductor devices. Furthermore, the growth of a $\beta$-$Ga_2O_3$ thin film requires a high substrate temperature and a high degree of vacuum, which results in an increase in production cost. In addition, even a high concentration (for example, $1 \times 10^{19}/cm^3$ or more) of dopant (Si) could not be used in $\beta$-$Ga_2O_3$ as donors unless the dopant (Si) was subjected to annealing treatment at high temperatures of 800 to 1100° C. after ion implantation.

On the other hand, $\alpha$-$Ga_2O_3$ has the same crystal structure as that of a sapphire substrate that is already used widely, and is therefore suitable for use in photoelectric devices. In addition, $\alpha$-$Ga_2O_3$ has a wider band gap than $\beta$-$Ga_2O_3$ and is therefore particularly useful for power devices. For these reasons, a semiconductor device using $\alpha$-$Ga_2O_3$ as a semiconductor is eagerly anticipated.

There has been proposed a semiconductor device using $\beta$-$Ga_2O_3$ as a semiconductor and using two layers of a Ti layer and an Au layer, three layers of a Ti layer, an Al layer, and an Au layer, or four layers of a Ti layer, an Al layer, a Ni layer, and an Au layer as an electrode by which ohmic characteristics that match this semiconductor may be obtained.

Moreover, there has been proposed a semiconductor device using $\beta$-$Ga_2O_3$ as a semiconductor and using any one of Au, Pt, and a multilayer body of Ni and Au as an electrode by which Schottky characteristics that match this semiconductor may be obtained.

However, when the conventional electrodes are applied to a semiconductor device using $\alpha$-$Ga_2O_3$ as a semiconductor, the following problems arise: for example, the electrodes do not function as a Schottky electrode or an ohmic electrode, are not bonded to a film, or impair semiconductor characteristics. Furthermore, for example, a leakage current occurs from an electrode edge in the electrode configurations; therefore, with these electrode configurations, it was impossible to obtain a semiconductor device that is satisfactory for practical use.

SUMMARY OF THE INVENTION

According to an example of the present disclosure, there is provided a multilayer structure including, a semiconductor film, having a corundum structure and containing a crystalline oxide semiconductor containing one or two or more metals selected from groups 9 and 13 of the periodic table; and an insulator film which is arranged on a part of the semiconductor film, having a taper angle of 20° or less.

Thus, in a multilayer structure of the present disclosure, crystal defects due to stress concentration in a semiconductor film under an edge of an insulator film are prevented or reduced.

DETAILED DESCRIPTION

Figure 1:
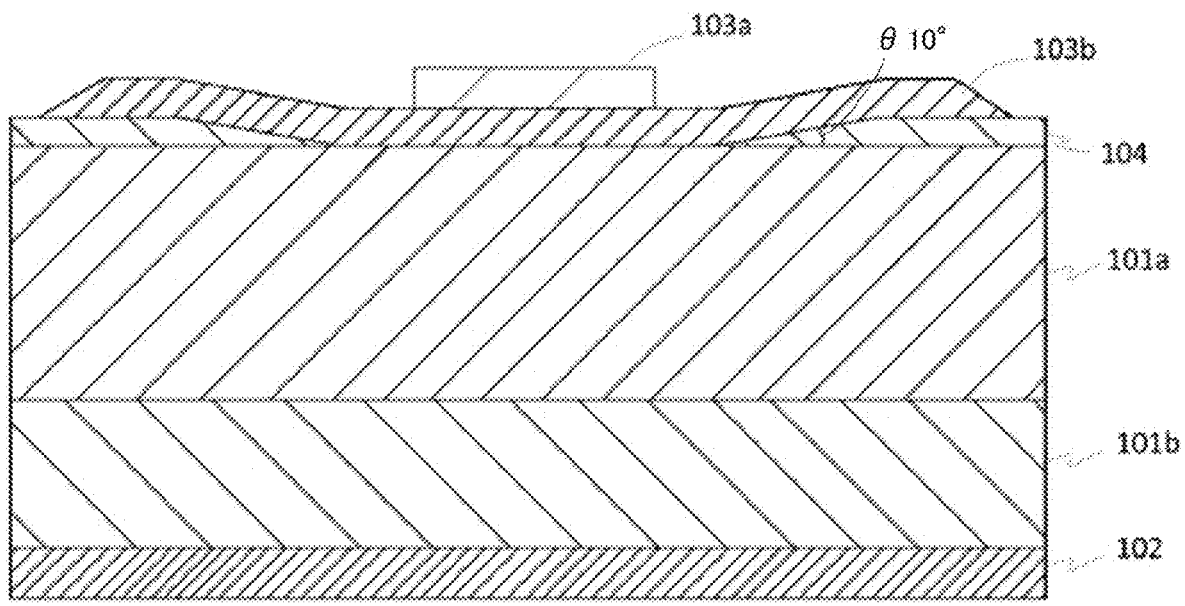
FIG. 1 is a sectional view schematically showing a preferred embodiment of a semiconductor device of the present disclosure.

The inventors of the present disclosure found out that a multilayer structure including, a semiconductor film, having a corundum structure and containing a crystalline oxide semiconductor containing one or two or more metals selected from groups 9 and 13 of the periodic table, and an insulator film which is arranged on a part of the semiconductor film, having a taper angle of 20° or less, has no crystal defects due to stress concentration in the semiconductor film under an edge of the insulator film and using this multilayer structure in a semiconductor device makes it possible to extend a depletion layer satisfactorily in a semiconductor layer and thereby achieves a low-loss semiconductor device in which a leakage current is suppressed, and found out that this makes it possible to solve the above-mentioned conventional problems.

Embodiments of the present disclosure will be described below with reference to the accompanying drawings. In the following description, the same parts and components are designated by the same reference numerals. The present embodiment includes, for example, the following disclosures.

[Structure 1]

A multilayer structure including, a semiconductor film, having a corundum structure and containing a crystalline oxide semiconductor containing one or two or more metals selected from groups 9 and 13 of the periodic table; and an insulator film which is arranged on a part of the semiconductor film, having a taper angle of 20° or less.

[Structure 2]

The multilayer structure according to [Structure 1], wherein the crystalline oxide semiconductor contains a metal of group 13 of the periodic table.

[Structure 3]

The multilayer structure according to [Structure 1] or [Structure 2] above, wherein the crystalline oxide semiconductor contains at least one metal selected from aluminum, indium, and gallium.

[Structure 4]

The multilayer structure according to any one of [Structure 1] to [Structure 3] above, wherein the crystalline oxide semiconductor contains at least gallium.

[Structure 5]

The multilayer structure according to any one of [Structure 1] to [Structure 4] above, wherein the taper angle of the insulator film is 10° or less.

[Structure 6]

The multilayer structure according to any one of [Structure 1] to [Structure 5] above, wherein a film thickness of at least a part of the insulator film is 1 µm or more.

[Structure 7]

A semiconductor device including at least: the multilayer structure according to any one of [Structure 1] to [Structure 6] above; and an electrode.

[Structure 8]

The semiconductor device according to [Structure 7] above, wherein the semiconductor device is a power device.

[Structure 9]

The semiconductor device according to [Structure 7] or [Structure 8] above, wherein the semiconductor device is a Schottky barrier diode.

[Structure 10]

A semiconductor system including a semiconductor device, characterized in that the semiconductor device is the semiconductor device according to any one of [Structure 7] to [Structure 9] above.

A multilayer structure of the present disclosure is a multilayer structure including, a semiconductor film, having a corundum structure and containing a crystalline oxide semiconductor containing one or two or more metals selected from groups 9 and 13 of the periodic table; and an insulator film which is arranged on a part of the semiconductor film, having a taper angle of 20° or less. The taper angle here refers to an angle of slope which a side surface (a surface facing a surface of the insulator film where the insulator film is in contact with the semiconductor film) of a tapered portion forms with a bottom surface (the surface of the insulator film where the insulator film is in contact with the semiconductor film) of the tapered portion when the tapered portion is observed from a direction perpendicular to the cross section thereof (a surface orthogonal to a front surface of the insulator film).

The insulator film is not limited to a particular insulator film as long as the insulator film has insulating properties, and may be a publicly known insulator film. In the present disclosure, the insulator film is preferably a film containing Si or Al and more preferably a film containing Si. Suitable examples of the film containing Si include silicon oxide films. Examples of the silicon oxide films include a $SiO_2$ film, a phosphorus-doped $SiO_2$ (PSG) film, a boron-doped $SiO_2$ film, a phosphorus- and boron-doped $SiO_2$ film (a BPSG film), a SiOC film, and a SiOF film. Examples of the film containing Al include an $Al_2O_3$ film, an AlGaO film, an InAlGaO film, an AlInZnGaO$_4$ film, and an AlN film. Examples of a method of forming the insulator film include, but are not limited to, CVD method, atmospheric pressure CVD method, plasma CVD method, mist CVD method, and a sputtering method. In the present disclosure, it is preferable that a method of forming the insulator film is mist CVD method, plasma CVD method, or atmospheric pressure CVD method. Moreover, the film thickness of the insulator film is also not limited to a particular film thickness and it is preferable that the film thickness of at least a part of the insulator film is 1 µm or more. According to the present disclosure, it is possible to more suitably obtain a multilayer structure without crystal defects due to stress concentration in a semiconductor layer even when such a thick insulator film is arranged on the semiconductor layer.

The insulator film has a taper angle of 20° or less, and a method of forming such a taper angle is not limited to a particular method and the taper angle can be formed by conventional method of in the present disclosure. Examples of a preferred method of forming the taper angle include a method of forming, on the insulator film, a thin film whose etching rate is higher than that of the insulator film and then applying a resist to the thin film and forming the taper angle by photolithography and etching.

Moreover, in the present disclosure, it is preferable that the taper angle is 10° or less. In the present disclosure, the lower limit of the taper angle is not limited to a particular lower limit and is preferably 0.2°, more preferably 1.0°, and most preferably 2.2°.

The semiconductor film (hereinafter also referred to as the "semiconductor layer") is not limited to a particular semiconductor film as long as the semiconductor film has a corundum structure and contains a crystalline oxide semiconductor containing one or two or more metals selected from group 9 (for example, cobalt, rhodium, or iridium) and group 13 (for example, aluminum, gallium, or indium) of the periodic table. Examples of the crystalline oxide semiconductor include a metal oxide containing one or two or more metals selected from aluminum, gallium, indium, rhodium, cobalt, and iridium. Moreover, it is preferable that the semiconductor layer contains a crystalline oxide semiconductor as a major component. In the present disclosure, the crystalline oxide semiconductor preferably contains a metal of group 13 of the periodic table, more preferably contains at least one metal selected from aluminum, indium, and gallium, and most preferably contains at least gallium. It is to be noted that a "major component" method that the crystalline oxide semiconductor constitutes preferably 50% or more, more preferably 70% or more, and further preferably 90% or more of all the components of the semiconductor layer in terms of atom ratio and means that the crystalline oxide semiconductor may constitute 100% of all the components of the semiconductor layer in terms of atom ratio. Furthermore, the thickness of the semiconductor layer is not limited to a particular thickness and may be 1 μm or less or 1 μm or more; in the present disclosure, the thickness of the semiconductor layer is preferably 1 μm or more and more preferably 10 μm or more. The surface area of the semiconductor film is not limited to a particular area and may be 1 mm² or more or 1 mm² or less; the surface area of the semiconductor film is preferably 10 mm² to 300 cm² and more preferably 100 mm² to 100 cm². In addition, the semiconductor layer is usually a monocrystal, but may be a polycrystal. Moreover, it is also preferable that the semiconductor layer is a multilayer film including at least a first semiconductor layer and a second semiconductor layer, the multilayer film in which the carrier density of the first semiconductor layer is lower than the carrier density of the second semiconductor layer when a Schottky electrode is provided on the first semiconductor layer. It is to be noted that, in this case, the second semiconductor layer usually contains dopant and the carrier density of the semiconductor layer may be appropriately set by adjusting the doping amount.

It is preferable that the semiconductor layer contains dopant. The dopant is not limited to particular dopant and may be publicly known dopant. Examples of the dopant include n-type dopant such as tin, germanium, silicon, titanium, zirconium, vanadium, or niobium, p-type dopant such as magnesium, calcium, and zinc, or the like. In the present disclosure, it is preferable that the n-type dopant is Sn, Ge, or Si. The content of dopant in the composition of the semiconductor layer is preferably 0.00001 atom % or more, more preferably 0.00001 to 20 atom %, and most preferably 0.00001 to 10 atom %. More specifically, in general, the concentration of dopant may be about $1\times10^{16}/cm^3$ to $1\times10^{22}/cm^3$ and the concentration of dopant may be set at a low concentration of about $1\times10^{17}/cm^3$ or less, for example. Furthermore, according to the present disclosure, the semiconductor layer may be made to contain dopant at a high concentration of about $1\times10^{20}/cm^3$ or more. In addition, the concentration of fixed charge of the semiconductor layer is also not limited to a particular concentration; in the present disclosure, it is preferable that the concentration of fixed charge of the semiconductor layer is $1\times10^{17}/cm^3$ or less because this makes it possible to form a depletion layer more satisfactorily in the semiconductor layer.

The semiconductor layer may be formed using a publicly known method. Examples of a method of the semiconductor layer include CVD method, MOCVD method, MOVPE method, mist CVD method, a mist epitaxy technique, MBE method, HVPE method, a pulse growth method, ALD method, or the like. In the present disclosure, it is preferable that a method of forming the semiconductor layer is mist CVD method or a mist epitaxy technique. In the mist CVD method or mist epitaxy technique, the semiconductor layer is formed by, for example, atomizing a raw material solution (an atomization process) to make droplets suspended, conveying the obtained atomized droplets to the space above a base by carrier gas (a conveying process) after atomization, and then stacking a semiconductor film containing a crystalline oxide semiconductor as a major component on the base by making the atomized droplets thermally react with each other near the base (a film formation process).

(Atomization Process)

The atomization process atomizes the raw material solution. A method of atomizing the raw material solution is not limited to a particular method as long as a method may atomize the raw material solution, and may be a publicly known method; in the present disclosure, an atomizing method using ultrasonic waves is preferable. The atomized droplets obtained using ultrasonic waves are preferable because the initial velocity thereof is zero, which allows them to be suspended in the air, and are very suitable because they are mists that are suspended in the space and may be conveyed as gas, not being sprayed like a spray, for example, and therefore cause no damage by collision energy. The size of a droplet is not limited to a particular size and may be a droplet of about a few mm; the size of a droplet is preferably 50 μm or less and more preferably 100 nm to 10 μm.

(Raw Material Solution)

The raw material solution is not limited to a particular raw material solution as long as the raw material solution may be atomized or turned into droplets and contains a raw material of which a semiconductor film may be formed, and may be an inorganic material or an organic material. In the present disclosure, the raw material is preferably metal or a metal compound and more preferably contains one or two or more metals selected from aluminum, gallium, indium, iron, chromium, vanadium, titanium, rhodium, nickel, cobalt, and iridium.

In the present disclosure, what is obtained by dissolving or dispersing the metal in an organic solvent or water in the form of a complex or salt may be suitably used as the raw material solution. Examples of the form of a complex include an acetylacetonato complex, a carbonyl complex, an ammine complex, and a hydrido complex. Examples of the form of salt include organometallic salt (for example, metallic acetate, metallic oxalate, and metallic citrate), metal sulfide salt, metal nitrate salt, metal phosphate salt, and metal halide salt (for example, metal chloride salt, metal bromide salt, and metal iodide salt).

Moreover, it is preferable to mix an additive such as halogen acid or oxidizer into the raw material solution. Examples of the halogen acid include hydrobromic acid, hydrochloric acid, and hydriodic acid, of which hydrobromic acid or hydriodic acid is preferable for the reason that it may curb the occurrence of an abnormal grain more efficiently. Examples of the oxidizer include peroxides such as hydrogen peroxide ($H_2O_2$), sodium peroxide ($Na_2O_2$), barium peroxide ($BaO_2$), and benzoyl peroxide ($(C_6H_5CO)_2O_2$), hypochlorous acid (HClO), perchloric acid, nitric acid, ozone water, and organic peroxides such as peroxyacetic acid and nitrobenzene.

The raw material solution may contain dopant. By making the raw material solution contain dopant, it is possible to perform doping satisfactorily. The dopant is not limited to particular dopant unless it interferes with the present disclosure. Examples of the dopant include n-type dopant such as tin, germanium, silicon, titanium, zirconium, vanadium, or niobium, p-type dopant such as Mg, H, Li, Na, K, Rb, Cs, Fr, Be, Ca, Sr, Ba, Ra, Mn, Fe, Co, Ni, Pd, Cu, Ag, Au, Zn, Cd, Hg, Ti, Pb, N, or P, or the like. The content of the dopant is appropriately set by using a calibration curve showing the relationship between the concentration of dopant in a raw material and a desired carrier density.

A solvent of the raw material solution is not limited to a particular solvent and may be an inorganic solvent such as water, an organic solvent such as alcohol, or a mixed solvent of an inorganic solvent and an organic solvent. In the present disclosure, the solvent preferably contains water and is more preferably water or a mixed solvent of water and alcohol.

(Conveying Process)

In the conveying process, the atomized droplets are conveyed into a film formation chamber by carrier gas. The carrier gas is not limited to particular carrier gas unless it interferes with the present disclosure, and suitable examples of the carrier gas include oxygen, ozone, inert gas such as nitrogen and argon, reducing gas such as hydrogen gas and forming gas, or the like. Moreover, one type of carrier gas may be used; two or more types of carrier gas may be used and diluent gas (for example, 10-fold diluent gas) with a decreased flow rate may be additionally used as second carrier gas. Furthermore, instead of one carrier gas supply point, two or more carrier gas supply points may be provided. The flow rate of carrier gas is not limited to a particular flow rate and is preferably 0.01 to 20 L/min and more preferably 1 to 10 L/min. When diluent gas is used, the flow rate of the diluent gas is preferably 0.001 to 2 L/min and more preferably 0.1 to 1 L/min.

(Film Formation Process)

In the film formation process, the semiconductor film is formed on a base by making the atomized droplets thermally react with each other near the base. A thermal reaction only has to make the atomized droplets react with each other by heat, and the reaction conditions and so forth are also not limited to particular reaction conditions and so forth unless they interfere with the present disclosure. In this process, the thermal reaction is generally carried out at a temperature equal to or higher than the evaporation temperature of a solvent; the temperature is preferably not too high temperatures (for example, 1000° C.) or lower, more preferably 650° C. or lower, and most preferably 300 to 650° C. Moreover, the thermal reaction may be carried out under any one of the following atmospheres: under vacuum, under a non-oxygen atmosphere (for example, under an inert gas atmosphere), under a reducing gas atmosphere, and under an oxygen atmosphere unless it interferes with the present disclosure; it is preferable that the thermal reaction is carried out under an inert gas atmosphere or under an oxygen atmosphere. Furthermore, the thermal reaction may be carried out under any one of the following conditions: under atmospheric pressure, under increased pressure, and under reduced pressure; in the present disclosure, it is preferable that the thermal reaction is carried out under atmospheric pressure. It is to be noted that a film thickness may be set by adjusting the film formation time.

(Base)

The base is not limited to a particular base as long as the base may support the semiconductor film. A material for the base is also not limited to a particular material unless it interferes with the present disclosure and the base may be a publicly known base, and the material for the base may be an organic compound or an inorganic compound. The base may have any shape and is effective for any shape, and examples of the shape thereof include a plate-like shape such as a flat plate-like shape or a disk-like shape, a fiber-like shape, a rod-like shape, a columnar shape, a prismatic shape, a tubular shape, a spiral shape, a spherical shape, and a ring-like shape; in the present disclosure, a substrate is preferable. The thickness of a substrate is not limited to a particular thickness in the present disclosure.

The substrate is not limited to a particular substrate as long as the substrate is a plate-like substrate and serves as a support of the semiconductor film. The substrate may be an insulator substrate, a semiconductor substrate, a metal substrate, or a conductive substrate; it is preferable that the substrate is an insulator substrate and it is also preferable that the substrate is a substrate having a metal film on the front surface thereof. Examples of the substrate include an underlying substrate containing a substrate material having a corundum structure as a major component, an underlying substrate containing a substrate material having a β-gallia structure as a major component, an underlying substrate containing a substrate material having a hexagonal structure as a major component, or the like. A "major component" here means that a substrate material with the above-described particular crystal structure constitutes preferably 50% or more, more preferably 70% or more, and further preferably 90% or more of all the components of a substrate material in terms of atom ratio, and a substrate material with the above-described particular crystal structure may constitute 100% of all the components of a substrate material in terms of atom ratio.

A substrate material is not limited to a particular substrate material unless it interferes with the present disclosure and may be a publicly known substrate material. Suitable examples of the substrate material with a corundum structure include $\alpha$-$Al_2O_3$ (a sapphire substrate), $\alpha$-$Ga_2O_3$, or the like, and more suitable examples include an a-plane sapphire substrate, an m-plane sapphire substrate, an r-plane sapphire substrate, a c-plane sapphire substrate, and an $\alpha$-type gallium oxide substrate (a-plane, m-plane, or r-plane). Examples of an underlying substrate whose major component is a substrate material with a β-gallia structure include a β-$Ga_2O_3$ substrate, a mixed crystal substrate containing $Ga_2O_3$ and $Al_2O_3$, the content of $Al_2O_3$ being more than 0 wt % and 60 wt % or less, or the like. Moreover, examples of an underlying substrate whose major component is a substrate material with a hexagonal structure include a SiC substrate, a ZnO substrate, and a GaN substrate.

In the present disclosure, annealing treatment may be performed after the film formation process. The annealing treatment temperature is not limited to a particular temperature unless it interferes with the present disclosure, and the annealing treatment temperature is generally 300 to 650° C. and preferably 350 to 550° C. Moreover, the annealing treatment time is generally 1 minute to 48 hours, preferably 10 minutes to 24 hours, and more preferably 30 minutes to 12 hours. It is to be noted that the annealing treatment may be carried out under any atmosphere unless it interferes with the present disclosure. The annealing treatment may be carried out under a non-oxygen atmosphere or under an oxygen atmosphere. Examples of the annealing treatment that is carried out under a non-oxygen atmosphere include annealing treatment that is carried out under an inert gas atmosphere (for example, under a nitrogen atmosphere), annealing treatment that is carried out under a reducing gas atmosphere, or the like; in the present disclosure, the annealing treatment is carried out preferably under an inert gas atmosphere and more preferably under a nitrogen atmosphere.

Moreover, in the present disclosure, the semiconductor film may be provided directly on the base or may be provided on the base with another layer, such as a stress relaxation layer (for example, a buffer layer or an ELO layer) or a separation sacrifice layer, placed therebetween. A method of forming each layer is not limited to a particular method and may be a publicly known method; in the present disclosure, mist CVD method is preferable.

In the present disclosure, the multilayer structure may be used in a semiconductor device after using a publicly known method such as separating the multilayer structure from the base or the like, or the multilayer structure may be used in a semiconductor device as it is.

The electrode (hereinafter also referred to as the "electrode layer") is not limited to a particular electrode as long as the electrode possesses e conductivity and may be used as an electrode unless it interferes with the present disclosure. A constituent material for the electrode layer may be a conductive inorganic material or a conductive organic material. In the present disclosure, it is preferable that a material for the electrode is metal. Suitable examples of the metal include at least one metal selected from groups 4 to 10 of the periodic table. Examples of metals of group 4 of the periodic table include titanium (Ti), zirconium (Zr), and hafnium (Hf). Examples of metals of group 5 of the periodic table include vanadium (V), niobium (Nb), and tantalum (Ta). Examples of metals of group 6 of the periodic table include chromium (Cr), molybdenum (Mo), and tungsten (W). Examples of metals of group 7 of the periodic table include manganese (Mn), technetium (Tc), and rhenium (Re). Examples of metals of group 8 of the periodic table include iron (Fe), ruthenium (Ru), and osmium (Os). Examples of metals of group 9 of the periodic table include cobalt (Co), rhodium (Rh), and iridium (Ir). Examples of metals of group 10 of the periodic table include nickel (Ni), palladium (Pd), and platinum (Pt). In the present disclosure, the electrode layer preferably contains at least one metal selected from groups 4 and 9 of the periodic table and more preferably contains a metal of group 9 of the periodic table. The layer thickness of the electrode layer is not limited to a particular thickness and is preferably 0.1 nm to 10 µm, more preferably 5 to 500 nm, and most preferably 10 to 200 nm. Moreover, in the present disclosure, it is preferable that the electrode layer consists of two or more layers having compositions that are different from each other. By adopting such a preferable configuration as the configuration of the electrode layer, it is possible not only to obtain a semiconductor device with better Schottky characteristics, but also to enhance the leakage current suppression effect.

When the electrode layer consists of two or more layers including a first electrode layer and a second electrode layer, it is preferable that the second electrode layer possesses conductivity and has higher conductivity than the first electrode layer. A constituent material for the second electrode layer may be a conductive inorganic material or a conductive organic material. In the present disclosure, it is preferable that a material for a first electrode layer is metal. In the present disclosure, it is preferable that a material for a second electrode layer is metal. Suitable examples of the metal include at least one metal selected from groups 8 to 13 of the periodic table. Examples of metals of groups 8 to 10 of the periodic table include the metals described as metals of groups 8 to 10 of the periodic table by way of example in the description of the electrode layer. Examples of metals of group 11 of the periodic table include copper (Cu), silver (Ag), and gold (Au). Examples of metals of group 12 of the periodic table include zinc (ZN) and cadmium (Cd). Moreover, examples of metals of group 13 of the periodic table include aluminum (Al), gallium (Ga), and indium (In). In the present disclosure, the second electrode layer preferably contains at least one metal selected from metals of groups 11 and 13 of the periodic table and more preferably contains at least one metal selected from silver, copper, gold, and aluminum. It is to be noted that the layer thickness of the second electrode layer is not limited to a particular layer thickness and is preferably 1 nm to 500 µm, more preferably 10 nm to 100 µm, and most preferably 0.5 to 10 µm. It is to be noted that, in the present disclosure, it is preferable that the film thickness of the insulator film under an outer edge of the electrode layer is greater than the film thickness of the insulator film from the opening to a point at a 1-µm distance therefrom because this makes it possible to achieve better withstand voltage characteristics of a semiconductor device.

A method of forming the electrode layer is not limited to a particular method and may be a publicly known method. Specific examples of a method of forming the electrode layer include a dry process and a wet process. Examples of the dry process include sputtering, vacuum evaporation, and CVD. Examples of the wet process include screen printing and die coating.

In the present disclosure, it is preferable that the electrode has a structure in which a film thickness decreases toward the outside of the semiconductor device. In this case, the electrode may have a taper angle, or the electrode may consist of two or more layers including a first electrode layer and a second electrode layer and the outer edge of the first electrode layer may be located outside the outer edge of the second electrode layer. In the present disclosure, when the electrode has a taper angle, this taper angle is not limited to a particular taper angle unless it interferes with the present disclosure, and the taper angle is preferably 80° or less, more preferably 60° or less, and most preferably 40° or less. The lower limit of the taper angle is also not limited to a particular lower limit and is preferably 0.2° and more preferably 1°. Moreover, in the present disclosure, when the outer edge of the first electrode layer is located outside the outer edge of the second electrode layer, it is preferable that the distance between the outer edge of the first electrode layer and the outer edge of the second electrode layer is 1 µm or more because this makes it possible to suppress a leakage current more effectively. Furthermore, in the present disclosure, it is also preferable that at least a part of a portion of the first electrode layer, the portion (hereinafter also referred to as the "sticking-out portion") sticking out from the outer edge of the second electrode layer, has a structure in which a film thickness decreases toward the outside of the semiconductor device because this makes it possible to achieve better withstand voltage properties of the semiconductor device. In addition, by combining such a preferable electrode configuration and the aforementioned preferable constituent material for the semiconductor layer, it is possible to obtain a lower-loss semiconductor device in which a leakage current is more satisfactorily suppressed.

Embodiments

Hereinafter, preferred embodiments of the present disclosure will be described in more detail using the drawings; it is to be noted that the present disclosure is not limited to these embodiments.

Figure 2:
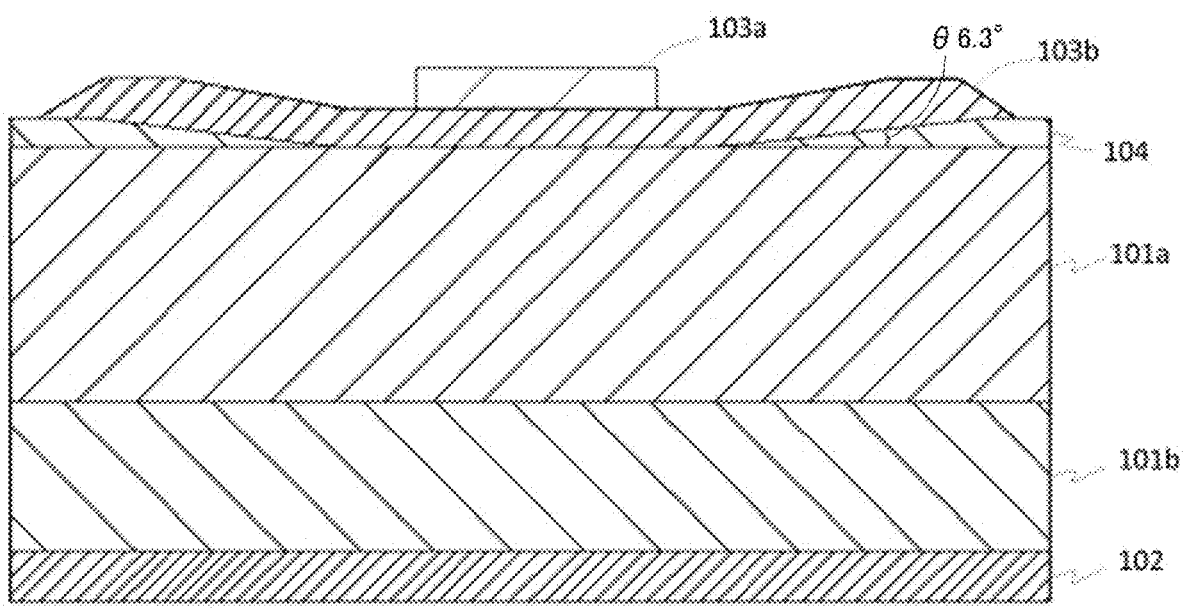
FIG. 2 is a sectional view schematically showing a preferred embodiment of the semiconductor device of the present disclosure.
Figure 3:
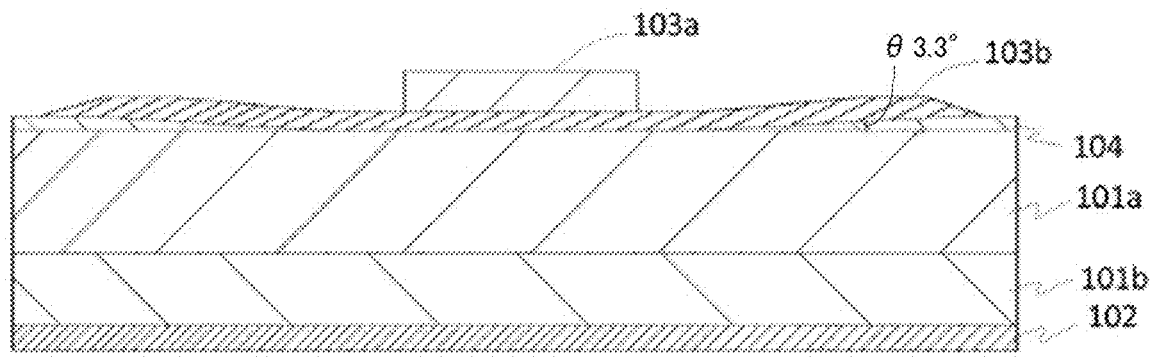
FIG. 3 is a sectional view schematically showing a preferred embodiment of the semiconductor device of the present disclosure.

FIG. 1 shows a principal portion of a Schottky barrier diode (SBD) which is one of the preferred embodiments of the present disclosure. The SBD of FIG. 1 includes an ohmic electrode 102, an n--type semiconductor layer 101a, an n+-type semiconductor layer 101b, Schottky electrodes 103a and 103b, and an insulator film 104. The insulator film 104 has a taper angle of 10° that causes a film thickness to decrease toward the inside of the semiconductor device. Moreover, the insulator film 104 is formed on the n--type semiconductor layer 101a and has an opening. The insulator film 104 allows the semiconductor device of FIG. 1 to prevent or reduce crystal defects at an edge, achieve a more satisfactorily formed depletion layer, achieve more satisfactory electric field relaxation, and suppress a leakage current more satisfactorily. Moreover, examples in which the taper angle of the insulator film 104 is 6.3° and 3.3° are shown in FIGS. 2 and 3, respectively.

Figure 4:
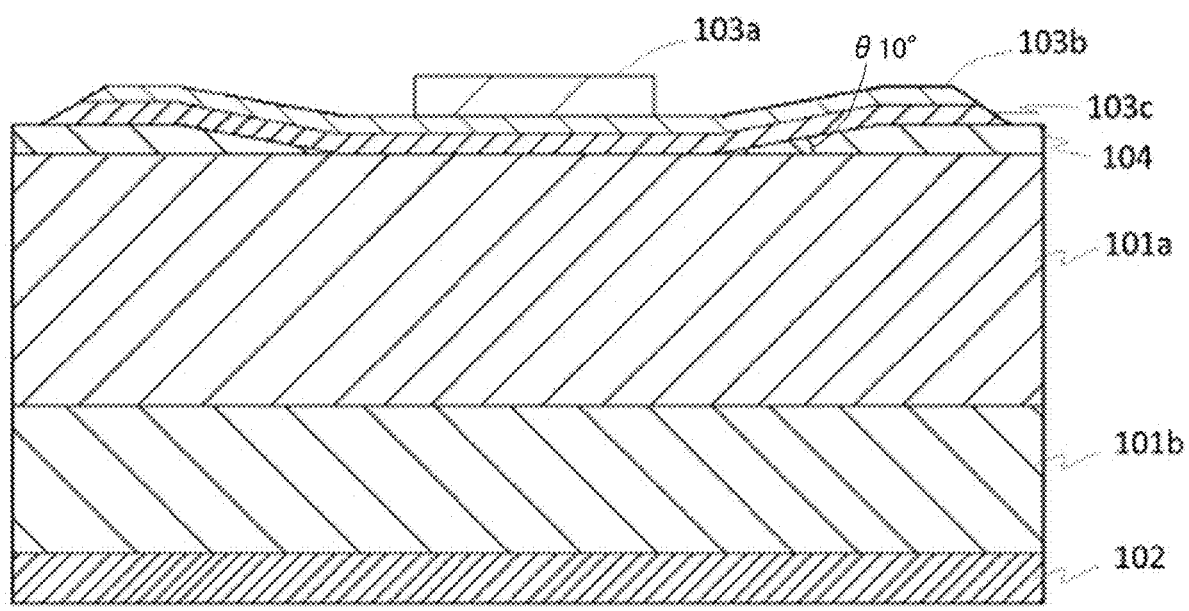
FIG. 4 is a sectional view schematically showing a preferred embodiment of the semiconductor device of the present disclosure.

FIG. 4 shows a principal portion of a Schottky barrier diode (SBD) which is one of the preferred embodiments of the present disclosure. The SBD of the FIG. 4 is different from the SBD of FIG. 1 in that a Schottky electrode 103 is configured with a metal layer 103a, a metal layer 103b, and a metal layer 103c. The semiconductor device of FIG. 4 may suppress a leakage current more satisfactorily because the outer edge of the metal layer 103b and/or the metal layer 103c as a first electrode layer is located outside the outer edge of the metal layer 103a as a second electrode layer. Furthermore, this configuration has better withstand voltage properties because a portion of the metal layer 103b and/or the metal layer 103c, the portion sticking out from the outer edge of the metal layer 103a, has a tapered region in which a film thickness decreases toward the outside of the semiconductor device.

Examples of a constituent material for the metal layer 103a include the aforementioned metal described by way of example as the constituent material for the second electrode layer. Moreover, examples of a constituent material for the metal layer 103b and the metal layer 103c include the aforementioned metal described by way of example as the constituent material for the first electrode layer. A method of forming each layer of FIG. 1 is not limited to a particular method unless it interferes with the present disclosure and may be a publicly known method. Examples of a method of forming each layer of FIG. 1 include a method of performing patterning by a photolithography process after forming a film by a vacuum evaporation method, CVD method, a sputtering method, or various coating technologies, a method of directly performing patterning using, for example, a printing technique after forming a film by a vacuum evaporation method, CVD method, a sputtering method, or various coating technologies, or the like.

Figure 5:
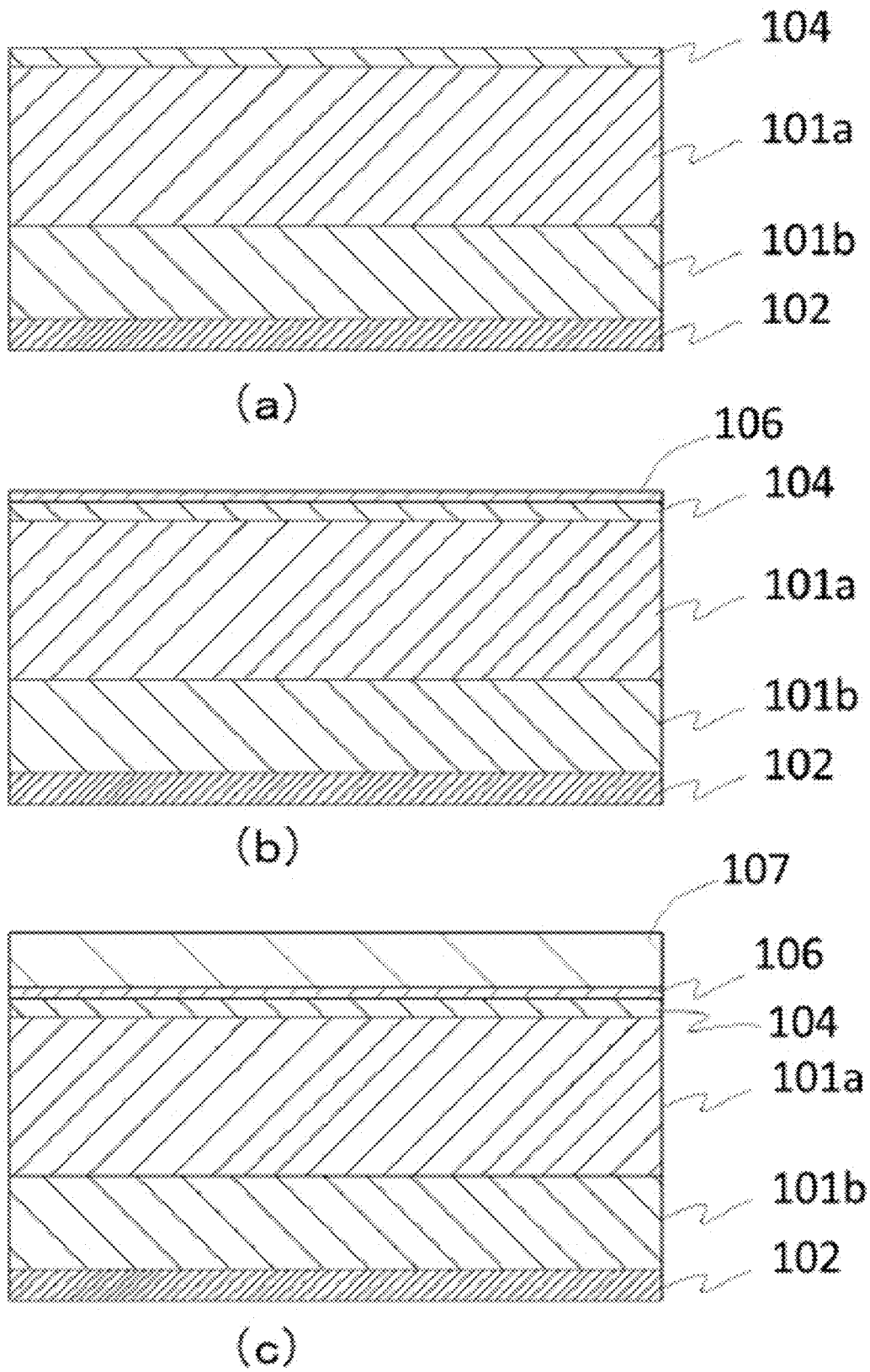
FIG. 5 at (a) to (c) is a diagram explaining a preferred method of producing the semiconductor device of FIG. 4.
Figure 11:
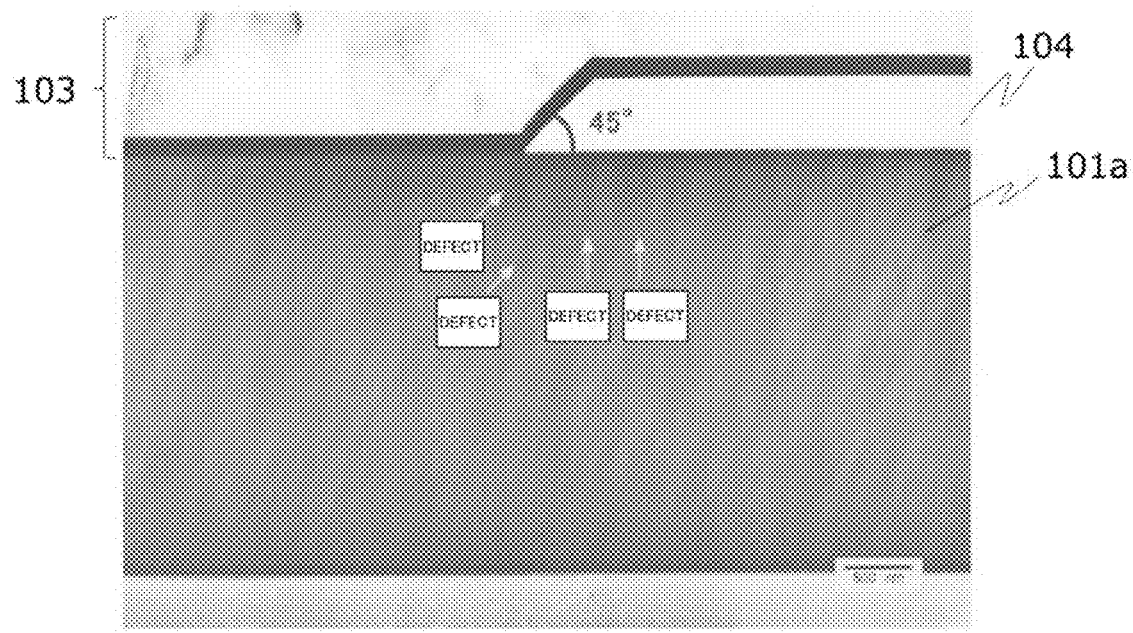
FIG. 11 is a diagram showing a TEM image of a multilayer structure with a taper angle being set at 45°.

Hereinafter, a preferred production process of the SBD of FIG. 4 will be described. It is to be noted that the present disclosure is not limited to these preferred production methods. In FIG. 5 at (a), an insulator film 104 is arranged on an n--type semiconductor layer 101a of a multilayer body of an ohmic electrode 102, the n--type semiconductor layer 101a, and an n+-type semiconductor layer 101b. Suitable examples of the insulator film 104 include a SiO$_2$ film obtained by PECVD method. A multilayer body of FIG. 5 at (b) is obtained by stacking a thin film 106, whose etching rate is higher than that of the insulator film 104, on the multilayer body of FIG. 5 at (a). Examples of a thin film whose etching rate is high include a SiO$_2$ thin film obtained by SOG method and a phosphorus-doped SiO$_2$ thin film (PSG). The thickness of the thin film 106 is not limited to a particular thickness and examples thereof include 1 μm or less, and a desired taper angle may be obtained by appropriately adjusting a material for the thin film 106 or the film thickness of the thin film 106. To obtain a desired taper angle, it is important to stack the insulator film 104 and the thin film 106 whose etching rate is higher than that of the insulator film 104 in this order. A multilayer body of FIG. 5 at (c) is obtained by stacking a resist 107 on the multilayer body of FIG. 5 at (b). Moreover, a multilayer body of FIG. 6 at (a) is obtained by performing a photolithography process and etching on the multilayer body of FIG. 5 at (c). Each of the photolithography process and the etching method may be a publicly known method. Examples of the etching method include a dry etching method, a wet etching method, or the like. A multilayer body of FIG. 6 at (b) is obtained by further performing etching on the multilayer body of FIG. 6 at (a) by which the resist 107 and the thin film 106 are removed therefrom. The taper angle of the insulator film 104 of FIG. 6 at (b) is 10°. In the present disclosure, it is important to set a taper angle at 20° or less. It is to be noted that crystal defects occur as shown in FIG. 11 when a multilayer body is obtained with a taper angle being set at 45°, for example. That is, defects are observed in the semiconductor layer 101a near the edge of the tapered portion of the insulator film 104 of FIG. 11. On the other hand, defects are not observed in a region (near the right edge of the drawing) away from the tapered portion of this insulator film 104 and a region (near the left edge of the drawing) with no insulator film. This defect is considered to have occurred due to great stress produced in a spot where a difference in a coefficient of linear thermal expansion between the insulator film 104 and the semiconductor layer 101a is large and mechanical stress caused at the time of formation of the insulator film 104 and in other heat treatment processes varies greatly. To reduce such variations in mechanical stress and make a defect less likely to occur, it is important to set a taper angle at 20° or less. These are new findings obtained by the inventors of the present disclosure through study.

Figure 6:
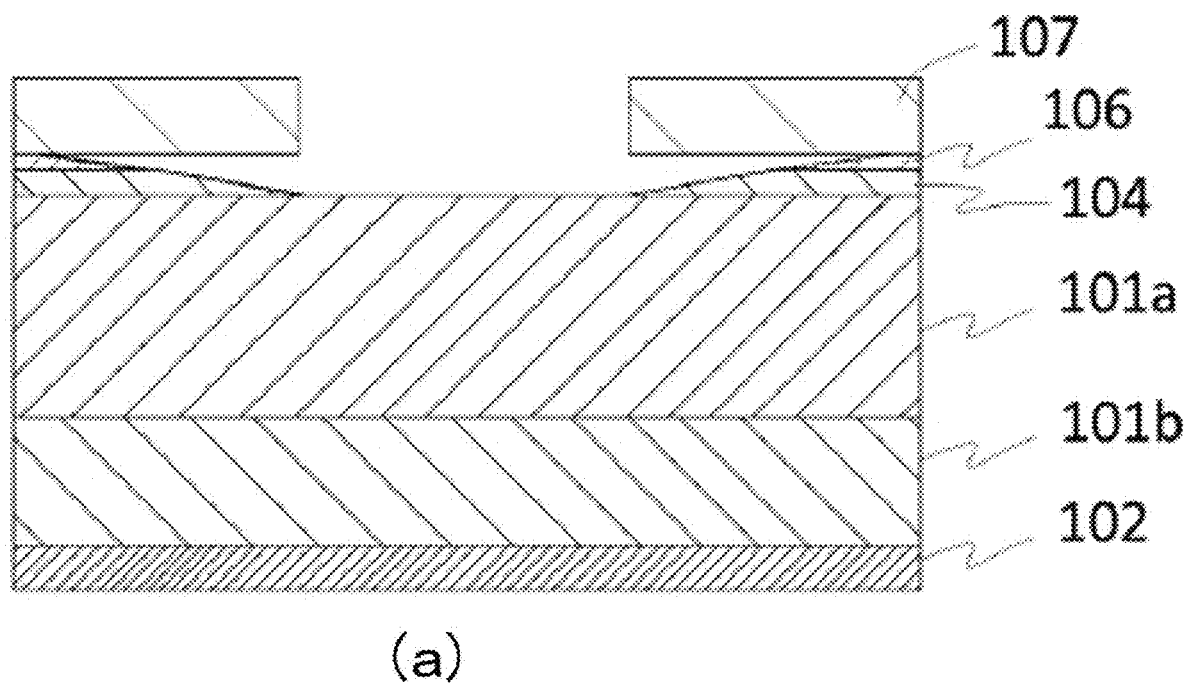
FIG. 6 at (a) and (b) is a diagram explaining the preferred method of producing the semiconductor device of FIG. 4.
Figure 6:
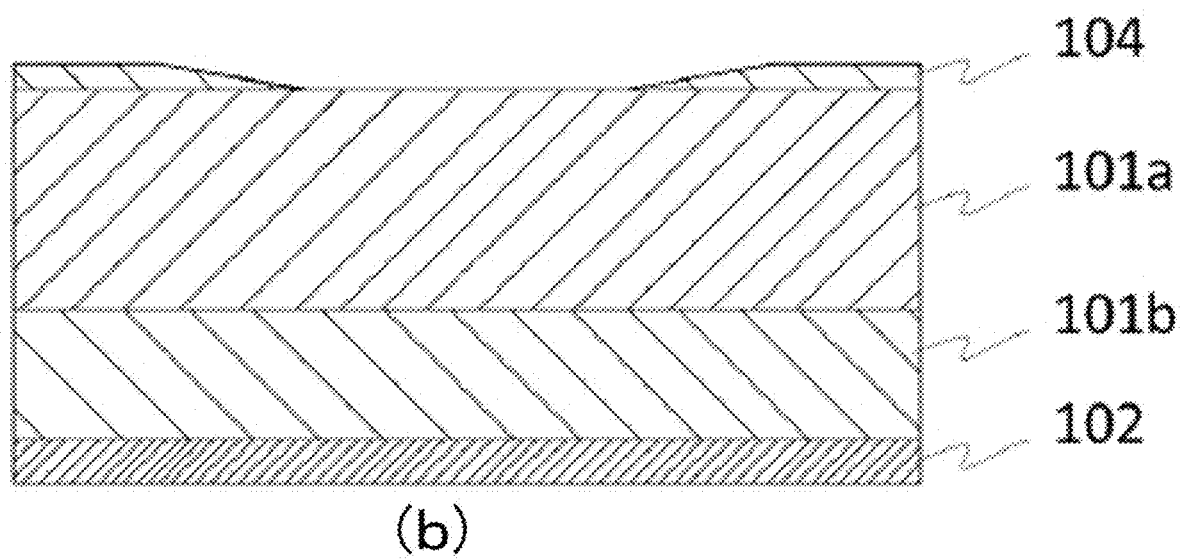
Figure 7:
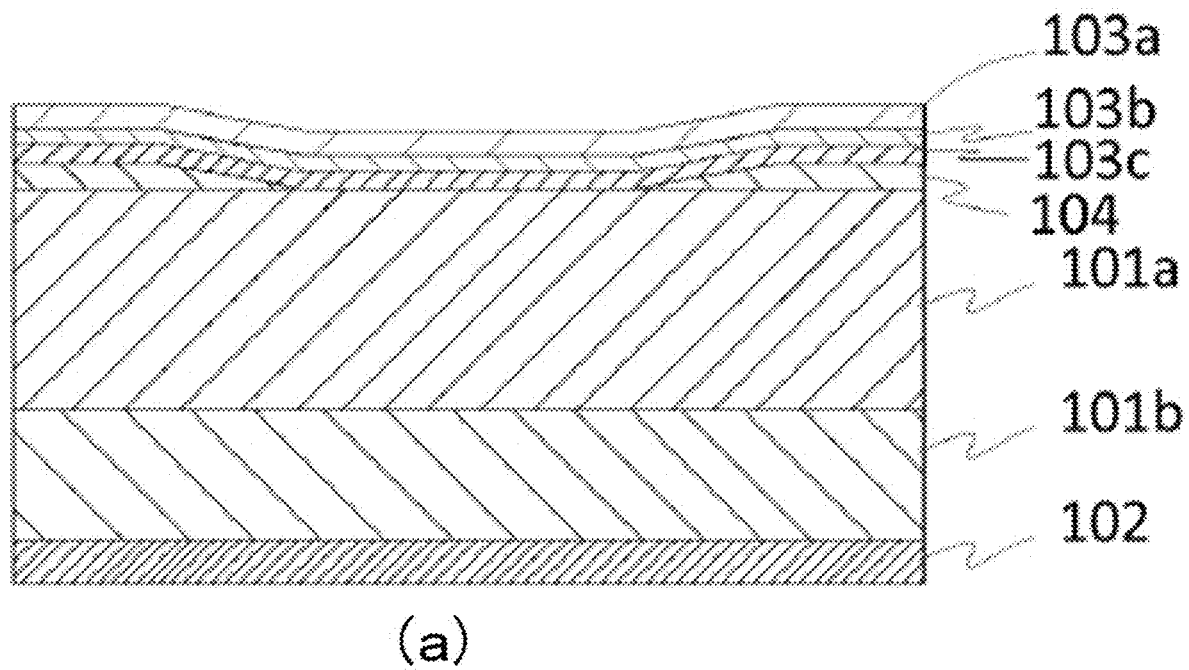
FIG. 7 at (a) and (b) is a diagram explaining the preferred method of producing the semiconductor device of FIG. 4.
Figure 7:
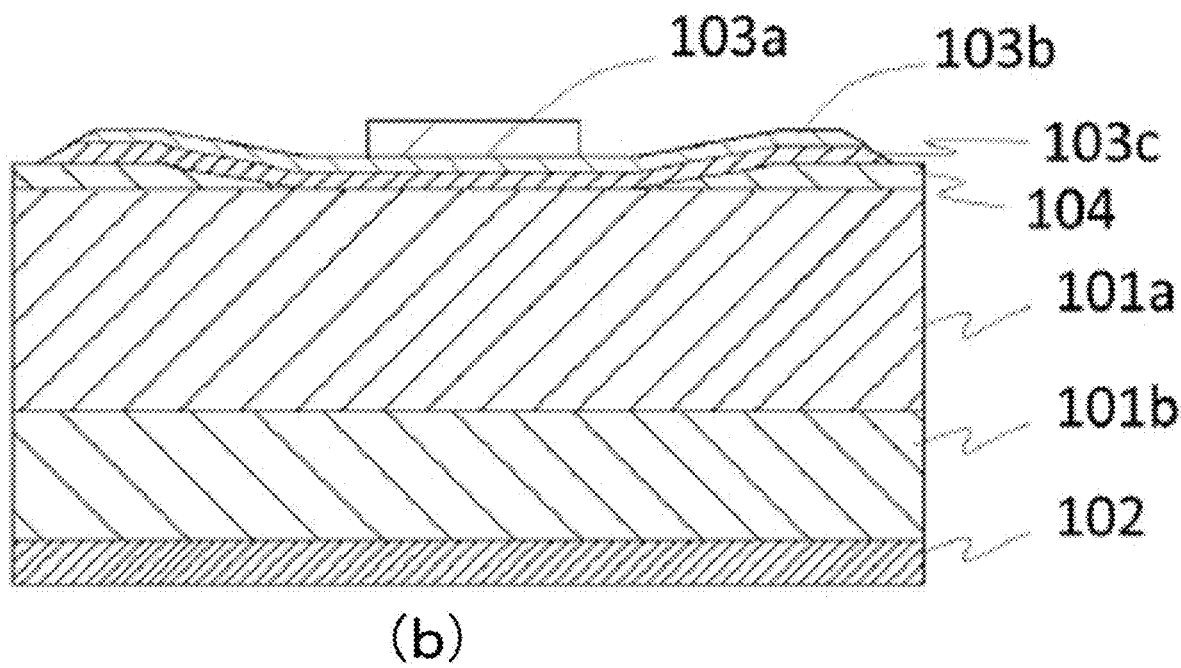

Next, a multilayer body of FIG. 7 at (a) is obtained by forming the metal layers 103a, 103b, and 103c on the multilayer body of FIG. 6 at (b) using the dry process or the wet process. Then, a multilayer body of FIG. 7 at (b) is obtained by removing excess portions of the metal layer 103a, the metal layer 103b, and the metal layer 103c using a publicly known etching technique. It is preferable to form the outer edge of the first electrode layer so as to have a taper shape by performing etching while moving a resist backward, for example, when performing the above etching. A semiconductor device obtained in this way has a configuration in which crystal defects at an edge are prevented or reduced, a depletion layer is more satisfactorily formed, more satisfactory electric field relaxation is achieved, and a leakage current may be more satisfactorily suppressed.

Figure 12:
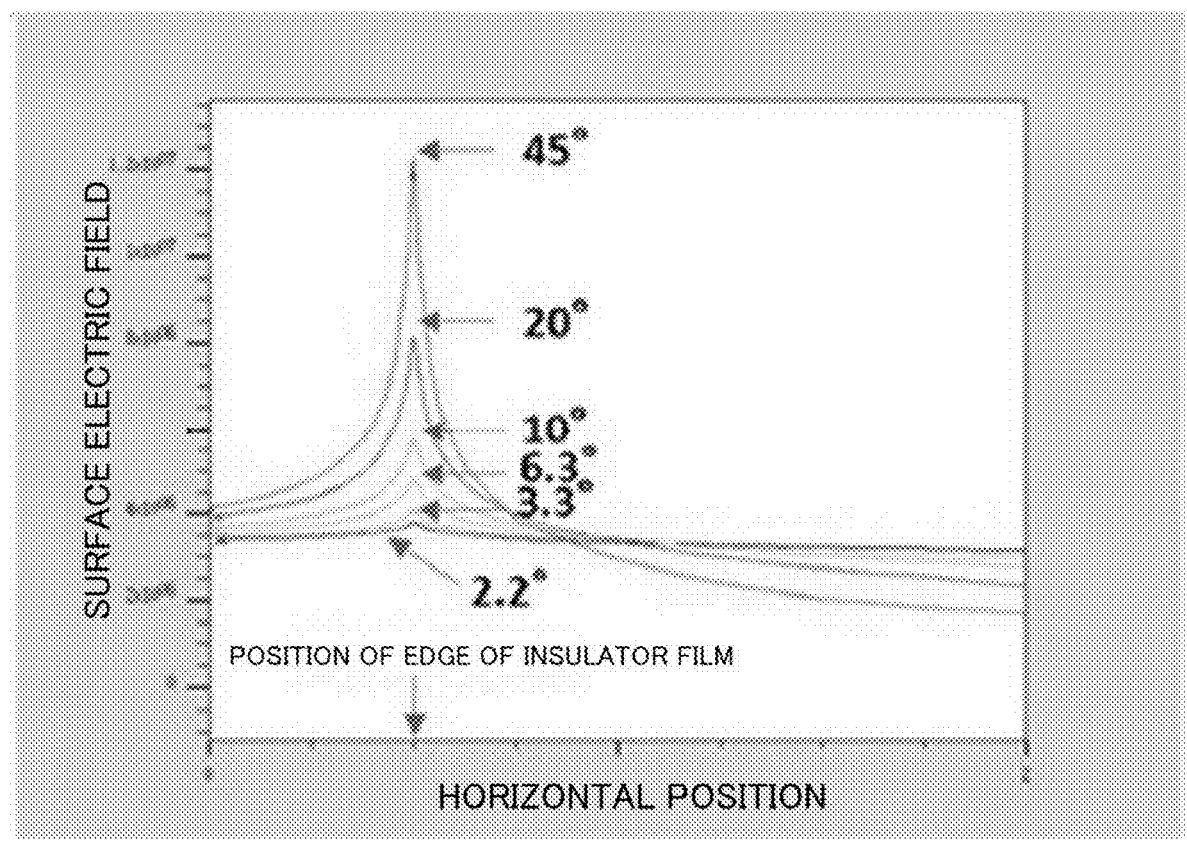
FIG. 12 is a diagram showing the simulation results in an embodiment.
Figure 13:
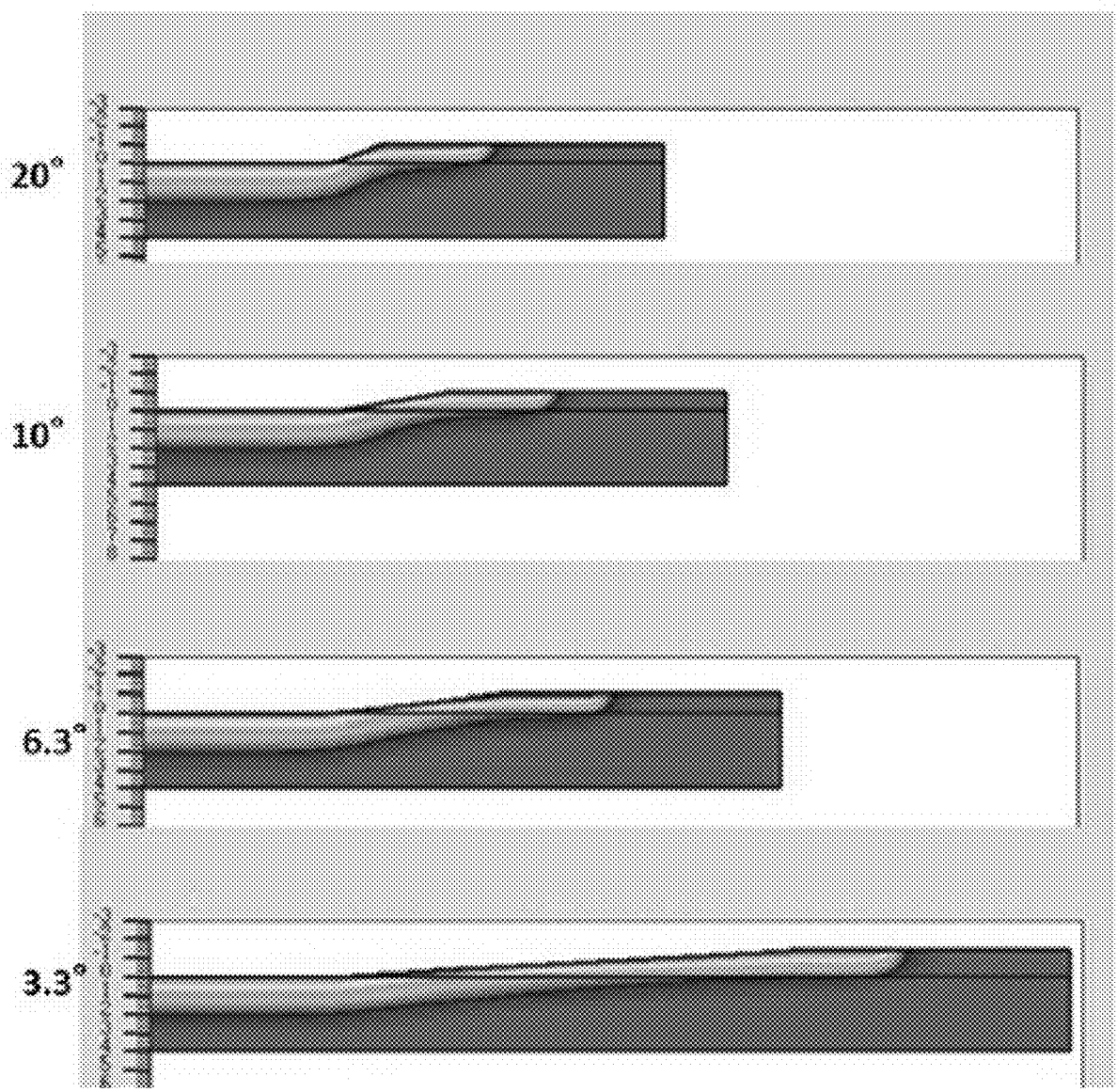
FIG. 13 is a diagram showing the simulation results in an embodiment.

The relationship between the horizontal position of a reverse current (@Vr=0 to 720 V) and the surface electric field of an α-Ga$_2$O$_3$ layer at a temperature of 300K when an α-Ga$_2$O$_3$ layer was used as the n--type semiconductor layer 101a and SiO$_2$ films (taper angles=2.2°, 3.3°, 6.3°, 10°, 20°, and 45°) were used as the insulator film 104 in the SBD of FIG. 7 at (b) was evaluated by a simulation. The evaluation results are shown in FIG. 12. As is clear from FIG. 12, when compared with a case where the SiO$_2$ film having a taper angle of 45° is used, electric field concentration in the surface electric field is noticeably reduced when the SiO$_2$ films having taper angles of 2.2 to 20° are used and electric field concentration in the surface electric field is more noticeably reduced when the SiO$_2$ films having taper angles of 2.2 to 10° are used. Moreover, the result obtained when the SiO$_2$ film having a taper angle of 45° was used in this simulation is shown in FIG. 12; as has been discussed above, crystal defects occur in this case and the electric field concentration shown in the simulation further increases. Furthermore, the potential distribution at 600 V at a temperature of 300K when SiO$_2$ films (taper angles=3.3°, 6.3°, 10°, and 20°) were used as the insulator film 104 was evaluated by a simulation. The evaluation results are shown in FIG. 13. As is clear from FIG. 13, satisfactory electric field relaxation is achieved when the SiO$_2$ films having taper angles of 3.3°, 6.3°, 10°, and 20° are used.

Figure 14:
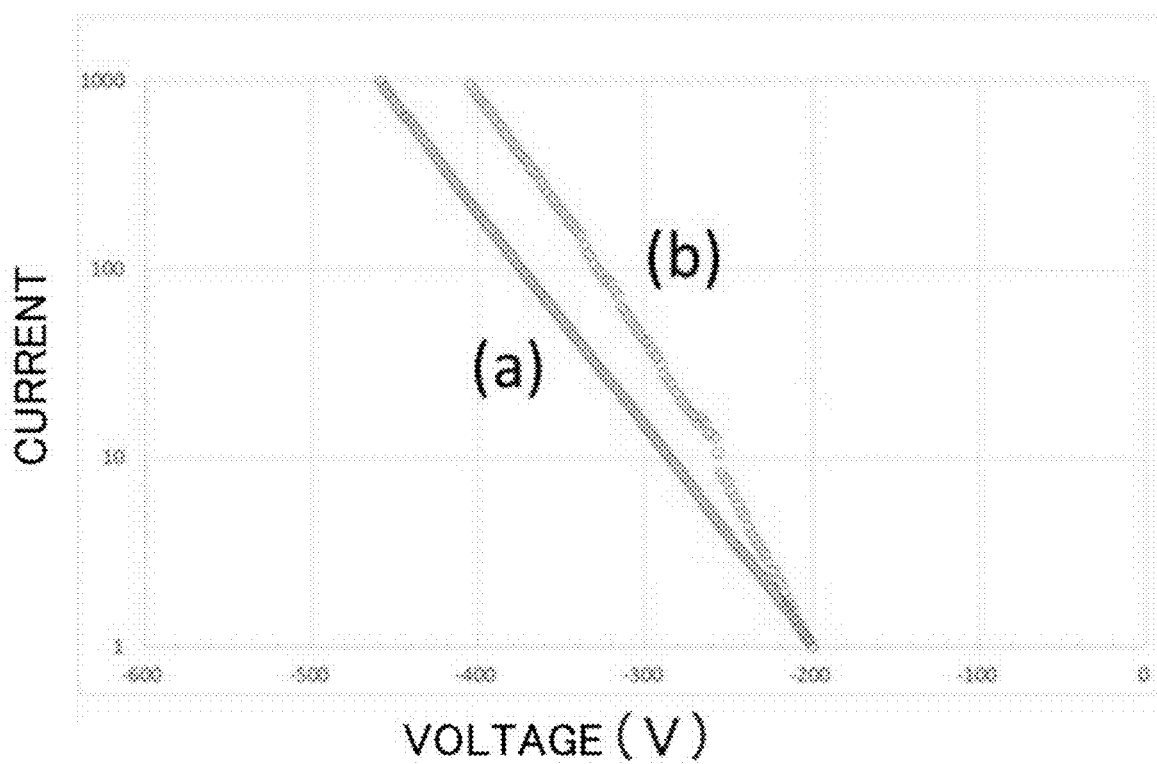
FIG. 14 is a diagram showing the I-V measurement results in an embodiment.

An SBD was fabricated by using Al, Ti, and Co as the metal layer 103a, the metal layer 103b, and the metal layer 103c, respectively, of the Schottky electrode, using an α-Ga₂O₃ layer as each of the n−-type semiconductor layer 101a and the n+-type semiconductor layer 101b, using a SiO₂ film as the dielectric film corresponding to the insulator film 104, and using a multilayer body of Ti/Ni/Au as the ohmic electrode 102 in the SBD of FIG. 4, and I-V measurement was performed. The results of the I-V measurement with the current values on the vertical axis normalized by the current values at a reverse applied voltage of −200 V are shown in FIG. 14. The I-V measurement results of the SBD fabricated with a tapered portion formed so as to have a taper angle θ of 10° as an embodiment are shown in a curve (a) of FIG. 14, and the I-V measurement results of the SBD fabricated with a tapered portion formed so as to have a taper angle θ of 45° as a comparative example are shown in a curve (b) of FIG. 14. The vertical axis has a logarithmic scale. As is clear from the curves (a) and (b) of FIG. 14(a), a leakage current is noticeably suppressed in the product of the present embodiment.

The semiconductor device is particularly useful for power devices. Examples of the semiconductor device include diodes (for example, a PN diode, a Schottky barrier diode, and a junction barrier Schottky diode), transistors (for example, a MOSFET and a MESFET), or the like; the semiconductor device is preferably a diode, in particular, and more preferably a Schottky barrier diode (SBD).

Figure 8:
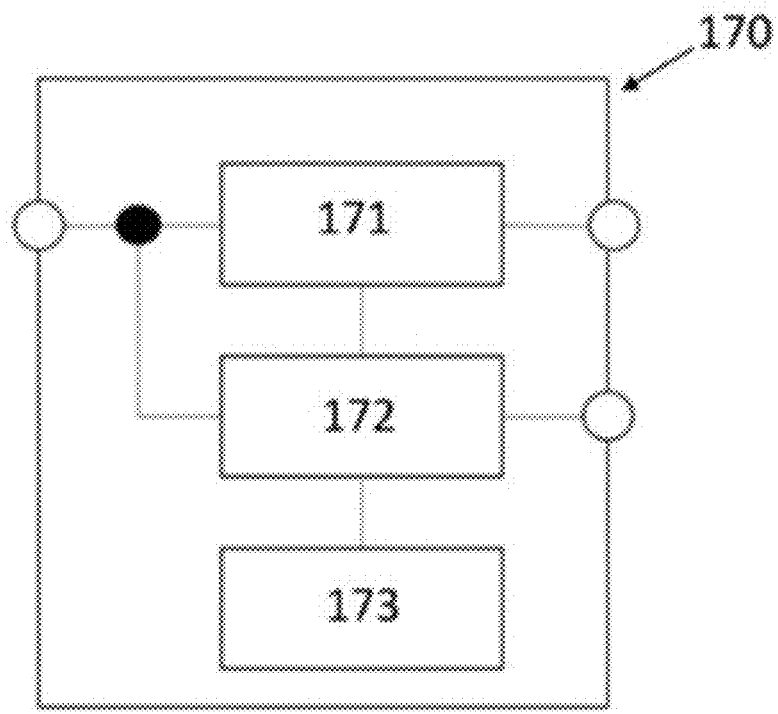
FIG. 8 is a diagram schematically showing a preferred example of a power supply system.
Figure 9:
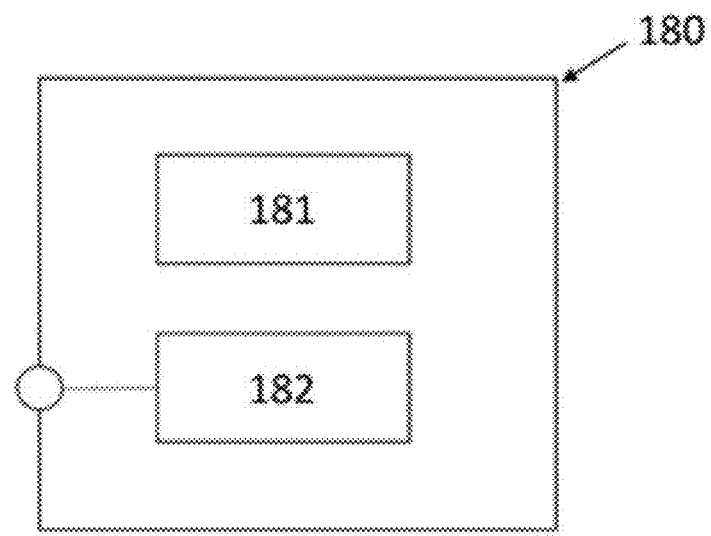
FIG. 9 is a diagram schematically showing a preferred example of a system unit.
Figure 10:
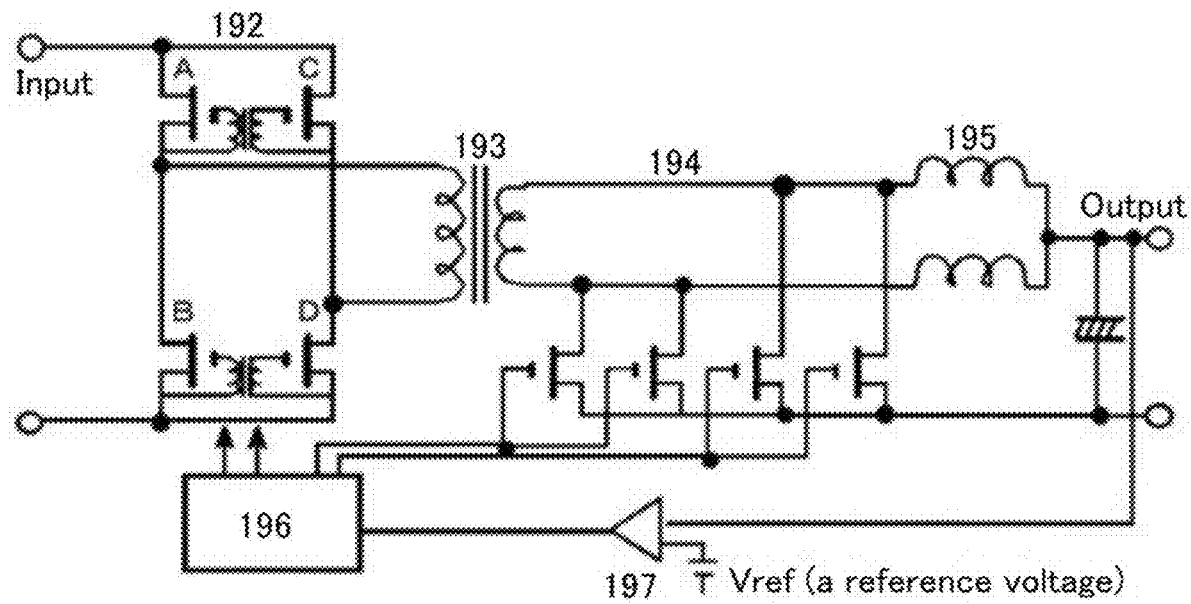
FIG. 10 is a diagram schematically showing a preferred example of a power supply circuit diagram of a power supply device.

The semiconductor device of the present disclosure is suitably used as a power module, an inverter, or a converter by using a publicly known method in addition to the above-described matter and is suitably used in a semiconductor system or the like using a power supply device, for example. The above-described power supply device may be fabricated from the semiconductor device or as the semiconductor device by connecting it to a wiring pattern or the like using a publicly known method. An example of a power supply system is shown in FIG. 8. FIG. 8 shows a power supply system 170 configured with a plurality of the power supply devices 171 and 172 and a control circuit 173. As shown in FIG. 9, the power supply system, combined with an electronic circuit 181 and a power supply system 182, may be used in a system unit 180. It is to be noted that one example of a power supply circuit diagram of a power supply device is shown in FIG. 10. FIG. 10 shows a power supply circuit of a power supply device configured with a power circuit and a control circuit, the power supply circuit in which a DC voltage is converted into AC by being switched at high frequencies by an inverter 192 (which is configured with MOSFETs A to D) and then electrical insulation and voltage transformation are performed by a transformer 193, rectification is performed by a rectification MOSFET 194 (A to B') and smoothing is then performed by a DCL 195 (smoothing coils L1 and L2) and a capacitor, and a direct-current voltage is output. At the time of output, the output voltage is compared with a reference voltage by a voltage comparator 197, and the inverter 192 and the rectification MOSFET 194 are controlled by a PWM control circuit 196 so as to obtain a desired output voltage.

The multilayer structure and the semiconductor device of the present disclosure may be used in all the fields such as semiconductors (for example, a compound semiconductor electronic device), electronic parts, electrical apparatus parts, optical and electronic photograph-related equipment, and industrial components, and are particularly useful for power devices.

The embodiments of the present invention are exemplified in all respects, and the scope of the present invention includes all modifications within the meaning and scope equivalent to the scope of claims.

REFERENCE SIGNS LIST

101a: n−-type semiconductor layer
101b: n+-type semiconductor layer
102: ohmic electrode
103: Schottky electrode
103a: metal layer
103b: metal layer
103c: metal layer
104: insulator film
106: thin film
107: resist
170: power supply system
171: power supply device
172: power supply device
173: control circuit
180: system unit
181: electronic circuit
182: power supply system
192: inverter
193: transformer
194: rectification MOSFET
195: DCL
196: PWM control circuit
197: voltage comparator

What is claimed is:

1. A multilayer structure comprising:
   a semiconductor film having a corundum structure and containing a crystalline oxide semiconductor, the crystalline oxide semiconductor containing gallium and a dopant, a content of the dopant in a composition of the semiconductor film being 0.00001 atom % or more; and
   an insulator film which is arranged on a part of the semiconductor film, the insulator film containing Si or Al,
   wherein the insulator layer has a taper angle of 20° or less.

2. The multilayer structure according to claim 1, wherein the taper angle of the insulator film is 10° or less.

3. The multilayer structure according to claim 1, wherein a film thickness of at least a part of the insulator film is 1 μm or more.

4. A semiconductor device comprising at least:
   the multilayer structure according to claim 1; and
   an electrode.

5. The semiconductor device according to claim 4, wherein the semiconductor device is a power device.

6. The semiconductor device according to claim 4, wherein the semiconductor device is a Schottky barrier diode.

7. A semiconductor system comprising a semiconductor device, wherein the semiconductor device is the semiconductor device according to claim 4.

8. A multilayer structure comprising:
   a semiconductor film having a corundum structure and containing a crystalline oxide semiconductor, the crystalline oxide semiconductor containing gallium; and
   an insulator film which is arranged on a part of the semiconductor film, the insulator film containing Si or Al,
   wherein a film thickness of at least a part of the insulator film is 1 μm or more, and
   wherein the insulator layer has a taper angle of 20° or less.

* * * * *